(12) United States Patent
Yamashita (10) Patent No.: US 8,872,086 B2
(45) Date of Patent: Oct. 28, 2014

(54) PHOTOELECTRIC CONVERSION DEVICE AND IMAGING SYSTEM

(75) Inventor: Yuichiro Yamashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 1019 days.

(21) Appl. No.: 12/670,560

(22) PCT Filed: Oct. 1, 2008

(86) PCT No.: PCT/JP2008/068255
§ 371 (c)(1),
(2), (4) Date: Jan. 25, 2010

(87) PCT Pub. No.: WO2009/044924
PCT Pub. Date: Apr. 9, 2009

(65) Prior Publication Data
US 2010/0200738 A1    Aug. 12, 2010

(30) Foreign Application Priority Data

Oct. 3, 2007  (JP) ................................. 2007-259874

(51) Int. Cl.
*H01L 27/00* (2006.01)
*H01L 27/146* (2006.01)
*H01L 31/0232* (2014.01)
*H01L 31/0216* (2014.01)

(52) U.S. Cl.
CPC .... *H01L 27/14629* (2013.01); *H01L 27/14627* (2013.01); *H01L 27/14621* (2013.01); *H01L 31/0232* (2013.01); *H01L 31/02162* (2013.01); *H01L 27/14685* (2013.01)
USPC .......... 250/208.1; 348/272; 348/273; 348/34; 348/133

(58) Field of Classification Search
CPC ................... H01L 27/14621; H01L 27/14627; H01L 27/14685; H01L 31/0232; H01L 31/02162
USPC .......... 250/208.1; 385/34, 133; 348/272, 273; 977/721, 762, 763
See application file for complete search history.

(56) References Cited

U.S. PATENT DOCUMENTS

| 7,623,056 B2 | 11/2009 | Yamashita | ..................... 341/163 |
| 7,633,539 B2 | 12/2009 | Yamashita | ..................... 348/294 |

(Continued)

FOREIGN PATENT DOCUMENTS

| JP | 06-224398 A | 8/1994 |
| JP | 2002-373976 A | 12/2002 |

(Continued)

OTHER PUBLICATIONS

Hsu, T.H. et al., "Dramatic Reduction of Optical Crosstalk in Deep-Submicrometer CMOS Imager With Air Gap Guard Ring", IEEE Electron Device Letters, IEEE Electron Devices Society, vol. 25, No. 6, Jun. 2004, pp. 375-377.

(Continued)

*Primary Examiner* — Georgia Y Epps
*Assistant Examiner* — Kevin Wyatt
(74) *Attorney, Agent, or Firm* — Fitzpatrick, Cella, Harper & Scinto (57) ABSTRACT

A photoelectric conversion device comprises: a plurality of photoelectric conversion elements each having a photo-sensing surface; insulation films; a plurality of light-guiding portions arranged above the insulation films, each of the plurality of light-guiding portions guiding light on the photo-sensing surface of each of the plurality of photoelectric conversion elements; and boundary portions, each of the boundary portions defines a boundary between the adjacent light-guiding portions and is formed of a material lower in refractive index than a material that forms the plurality of light-guiding portions, wherein a width of each of the boundary portions is not more than half a shortest wavelength in a wavelength range of visible light, and a height from a lower surface to an upper surface of each of the plurality of light-guiding portions is not less than double a longest wavelength in the wavelength range of visible light.

33 Claims, 7 Drawing Sheets

(56) References Cited

U.S. PATENT DOCUMENTS

| | | | |
|---|---|---|---|
| 7,923,799 B2 * | 4/2011 | Lenchenkov | 257/432 |
| 2005/0040317 A1 | 2/2005 | Yaung | 250/208.1 |
| 2005/0139945 A1 | 6/2005 | Lim | |
| 2005/0190453 A1 | 9/2005 | Dobashi | 359/619 |
| 2006/0038252 A1 * | 2/2006 | Mouli | 257/446 |
| 2006/0081898 A1 | 4/2006 | Wang et al. | |
| 2006/0125948 A1 * | 6/2006 | Orita et al. | 348/340 |
| 2006/0186313 A1 * | 8/2006 | Yokota et al. | 250/208.1 |
| 2007/0262366 A1 * | 11/2007 | Baek et al. | 257/292 |
| 2007/0280587 A1 * | 12/2007 | Makita | 385/14 |
| 2008/0036890 A1 | 2/2008 | Yamashita et al. | 348/308 |
| 2008/0265353 A1 * | 10/2008 | Komoguchi et al. | 257/432 |
| 2009/0242736 A1 * | 10/2009 | Rennie | 250/208.1 |
| 2009/0244328 A1 | 10/2009 | Yamashita | 348/241 |
| 2009/0250777 A1 * | 10/2009 | Takamiya | 257/432 |
| 2009/0251578 A1 | 10/2009 | Yamashita | 348/302 |
| 2009/0256176 A1 | 10/2009 | Kobayashi et al. | 257/225 |
| 2009/0284632 A1 | 11/2009 | Onuki et al. | 348/302 |
| 2011/0108938 A1 * | 5/2011 | Nozaki et al. | 257/432 |

FOREIGN PATENT DOCUMENTS

| | | | |
|---|---|---|---|
| JP | 2003-264281 A | | 9/2003 |
| JP | 2005-251804 A | | 9/2005 |
| JP | 2006-324439 A | | 11/2006 |
| JP | 2007/123536 A | | 5/2007 |
| JP | 2007291195 A | * | 11/2007 |
| JP | 2008-010544 A | | 1/2008 |

OTHER PUBLICATIONS

Hsu, et al., "Color Mixing Improvement of CMOS Image Sensor With Air-Gap-Guard Ring in Deep-Submicrometer CMOS Technology", IEEE Electron Device Letters, vol. 26, No. 5, pp. 301-303, May 1, 2005.

European Search Report dated Nov. 25, 2011, in Appln. No. 08835419.6.

Office Action—Japanese Patent Appln. No. 2007-259874, Japanese Patent Office, Aug. 7, 2012.

* cited by examiner

PHOTOELECTRIC CONVERSION DEVICE AND IMAGING SYSTEM

TECHNICAL FIELD

The present invention relates to a photoelectric conversion device and imaging system.

BACKGROUND ART

A photoelectric conversion device is required to efficiently collect incident light on the photo-sensing surface of a photoelectric conversion element. In a solid-state image sensing apparatus disclosed in Japanese Patent Laid-Open No. 06-224398, a resin gap layer is interposed between a microlens and the photo-sensing surface of a photoelectric conversion element, as shown in FIG. 1 in Japanese Patent Laid-Open No. 06-224398. A layer lower in refractive index than the gap layer is interposed between the gap layer and a transfer electrode for transferring the charges of the photoelectric conversion element. According to Japanese Patent Laid-Open No. 06-224398, obliquely incident light, which does not contribute to photoelectric conversion in a conventional technique, can enter the photo-sensing surface of the photoelectric conversion element by utilizing total reflection at the interface between the gap layer and the low-refractive-index layer.

However, the solid-state image sensing apparatus in Japanese Patent Laid-Open No. 06-224398 does not examine light entering a boundary region between the gap layer of a predetermined pixel and that of a pixel adjacent to the predetermined one. For example, when light, which travels perpendicularly to the photo-sensing surface of a photoelectric conversion element, enters the boundary region between the gap layer of a predetermined pixel and that of a pixel adjacent to the predetermined one, it is difficult to guide light to the photo-sensing surface of the photoelectric conversion element.

As the area of a pixel including a photoelectric conversion element decreases, the ratio of the area of the boundary region to the pixel area increases. Light entering the boundary region cannot be ignored.

DISCLOSURE OF INVENTION

It is an aim of the present invention to efficiently collect light entering a photoelectric conversion device on the photo-sensing surface of a photoelectric conversion element in the photoelectric conversion device.

According to the first aspect of the present invention, a photoelectric conversion device is characterized by comprising: a plurality of photoelectric conversion elements each having a photo-sensing surface; insulation films arranged on the plurality of photoelectric conversion elements; a plurality of light-guiding portions arranged above the insulation films, each of the plurality of light-guiding portions guiding light on the photo-sensing surface of each of the plurality of photoelectric conversion elements; and boundary portions, each of the boundary portions defines a boundary between the adjacent light-guiding portions and is formed of a material lower in refractive index than a material that forms the plurality of light-guiding portions, wherein a width of each of the boundary portions is not more than half a shortest wavelength in a wavelength range of visible light, and a height from a lower surface to an upper surface of each of the plurality of light-guiding portions is not less than double a longest wavelength in the wavelength range of visible light.

According to the second aspect of the present invention, a photoelectric conversion device is characterized by comprising: a plurality of photoelectric conversion elements each having a photo-sensing surface; insulation films arranged on the plurality of photoelectric conversion elements; a plurality of light-guiding portions arranged above the insulation films of plural layers, each of the plurality of light-guiding portions guiding light on the photo-sensing surface of each of the plurality of photoelectric conversion elements; and boundary portions, each of the boundary portions defines a boundary between the adjacent light-guiding portions and is formed of a material lower in refractive index than a material that forms the plurality of light-guiding portions, wherein a width of each of the boundary portions is not more than half a shortest wavelength in a wavelength range of visible light, and a height from a lower surface to an upper surface of each of the plurality of light-guiding portions is not less than four times the width of each of the boundary portions.

According to the third aspect of the present invention, an imaging system is characterized by comprising: a photoelectric conversion device according to the first or second aspect of the present invention; an optical system which forms an image on an image sensing plane of the photoelectric conversion element; and a signal processing unit which processes a signal output from the photoelectric conversion device to generate image data.

According to the present invention, it is possible to efficiently collect light entering a photoelectric conversion device on the photo-sensing surface of a photoelectric conversion element in the photoelectric conversion device.

Further features of the present invention will become apparent from the following description of exemplary embodiments with reference to the attached drawings.

BRIEF DESCRIPTION OF DRAWINGS

FIG. 2 includes 2A and 2B which are graphs for explaining the behavior of light in the photoelectric conversion device according to the first embodiment;

FIG. 7 includes 7A to 7F which are sectional views for explaining steps of manufacturing the photoelectric conversion device according to the second embodiment;

BEST MODE FOR CARRYING OUT THE INVENTION

The present invention has features in the structure of a light-guiding portion and in the arrangement between the light-guiding portion and other light-guiding portions adjacent to the light-guiding portion, the light-guiding portions arranged in correspondence with each photoelectric conversion element in a photoelectric conversion device having a plurality of photoelectric conversion elements.

More specifically, the present invention has features in that a clearance between adjacent light-guiding portions (i.e. a width of the boundary portion) is set to be not more than half the shortest wavelength in the wavelength range of visible light, and a height of the light-guiding portion is set to be not less than double the longest wavelength in the wavelength range of visible light. This structure can efficiently guide (or collect) light entering the boundary portion on the photo-sensing surface of a photoelectric conversion element, and thereby increase the light collection ratio representing the ratio of light guided to the photo-sensing surface of the photoelectric conversion element to light entering the photoelectric conversion device.

Visible light is also called a visible spectrum, and is defined as electromagnetic waves which falls within the range of visible electromagnetic spectra. The wavelength of visible light generally ranges from about 400 nm (inclusive) to 750 nm (inclusive). See "Dictionary of Technical Terms of Optics, 3rd ed.", Optoelectronics for the wavelength range of visible light.

In this specification, the term "wavelength range of visible light" also means the wavelength range of light components passing through color filters (e.g., red, green, and blue primary color filters) arranged in correspondence with respective photoelectric conversion elements. In this case, the "shortest wavelength in the wavelength range of visible light" means a wavelength (e.g., blue wavelength) defined by the spectral transmittance distribution of a color filter of a color corresponding to the shortest wavelength among colors defined by color filters in the photoelectric conversion device. The "longest wavelength in the wavelength range of visible light" means a wavelength (e.g., red wavelength) defined by the spectral transmittance distribution of a color filter of a color corresponding to the longest wavelength among colors defined by color filters in the photoelectric conversion device.

Other terms used in the specification will also be explained.

A pixel is a minimum unit including a photoelectric conversion element. The pixel may include the above-mentioned color filter, a transistor, and the like, in addition to the photoelectric conversion element.

A "substrate" is a semiconductor substrate serving as a material substrate, but may also include a material substrate processed as follows. For example, the substrate means even a member in which one or a plurality of semiconductor regions or the like are formed, a member in the course of a series of manufacturing processes, or a member having undergone a series of manufacturing processes.

The present invention will be described in detail with reference to the accompanying drawings.

(First Embodiment)

Figure 1:
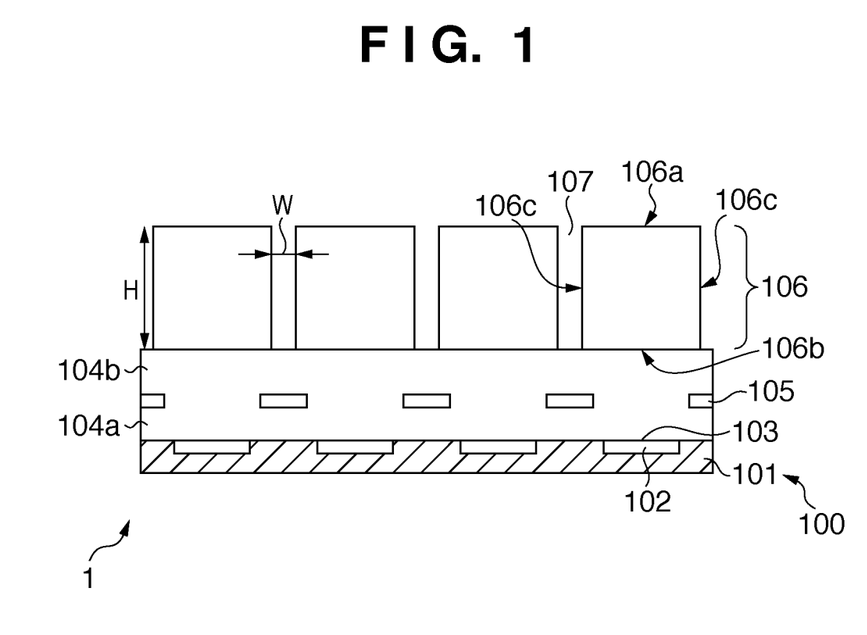
FIG. 1 is a sectional view of a photoelectric conversion device according to the first embodiment.

FIG. 1 is a sectional view of a photoelectric conversion device 1 according to the first embodiment. Light-guiding portions are arranged on a plurality of photoelectric conversion elements in correspondence with the respective photoelectric conversion elements. The clearance between adjacent light-guiding portions (i.e. the width of the boundary portion) and the height of the light-guiding portion are set to predetermined values.

In FIG. 1, a substrate 100 includes a well 101 and photoelectric conversion elements 102. The substrate 100 is formed of, for example, silicon.

The well 101 contains an impurity of the first conductivity type (e.g., P type) lower in concentration than the photoelectric conversion element 102.

The photoelectric conversion element 102 contains an impurity of the second conductivity type (e.g., N type) which corresponds to the carrier and is higher in concentration than the well 101. The second conductivity type is opposite conductivity type of the first conductivity type.

The photoelectric conversion element 102 has a photo-sensing surface 103. A plurality of photoelectric conversion elements 102 are arranged in the substrate 100. Each photoelectric conversion element 102 performs photoelectric conversion in a depletion layer formed near the boundary between the photoelectric conversion element 102 and the well 101, generating and accumulating charges corresponding to light incident on the photo-sensing surface 103.

Insulation films 104a and 104b of plural layers are arranged on the photoelectric conversion elements 102. The insulation film 104a insulates the surface of the substrate 100 from the wiring layer 105 (to be described later). The insulation film 104b insulates a layer on it from the wiring layer 105. Each of the insulation films 104a and 104b is formed of, for example, a silicon oxide film.

The wiring layer 105 is interposed between the insulation films 104a and 104b. The wiring layer 105 is formed of, for example, an intermetallic compound mainly containing aluminum.

A plurality of light-guiding portions 106 are formed on the insulation film 104b in correspondence with the respective photoelectric conversion elements 102. The material which forms the light-guiding portion 106 is, for example, silicon oxide, and air is filled in a boundary portion 107 between adjacent light-guiding portions. In this structure, light entering the light-guiding portion 106 from an upper surface 106a of the light-guiding portion 106 is easily totally reflected by a side surface 106c serving as the interface between the light-guiding portion 106 and the boundary portion 107, and guided to a lower surface 106b. When the refractive indices of the light-guiding portion 106 and insulation film 104b are almost equal to each other, light is hardly reflected at the interface between them. Hence, light guided to the lower surface 106b easily reaches the photo-sensing surface 103 of the photoelectric conversion element 102 via the insulation films 104a and 104b.

A height H of each light-guiding portion 106 is set to be not less than double the longest wavelength in the wavelength range of visible light. The clearance W between two adjacent light-guiding portions 106 (i.e. a width W of the boundary portion 107) is set to be not more than half the shortest wavelength in the wavelength range of visible light. With this structure, light entering a region (boundary portion) where no light-guiding portion exists is refracted toward the center of the light-guiding portion, and easily enters the light-guiding portion from its side surface. As described above, light entering the light-guiding portion is easily guided to the photo-sensing surface of the photoelectric conversion element. This can increase the light collection ratio representing the ratio of light guided to the photo-sensing surface of the photoelectric conversion element to light entering the photoelectric conversion device 1.

In FIG. 1, the height H of the light-guiding portion 106 is set to be not less than double (e.g., 1.5 μm) the longest wavelength in the wavelength range of visible light. The clearance W between adjacent light-guiding portions 106 (i.e. the width W of the boundary portion 107) is set to be not more than half (e.g., 200 nm) the shortest wavelength in the wavelength range of visible light. The height H of the light-guiding portion 106, the width W of the boundary portion 107, and the wavelength of collectable light will be described in detail later.

Figure 2:
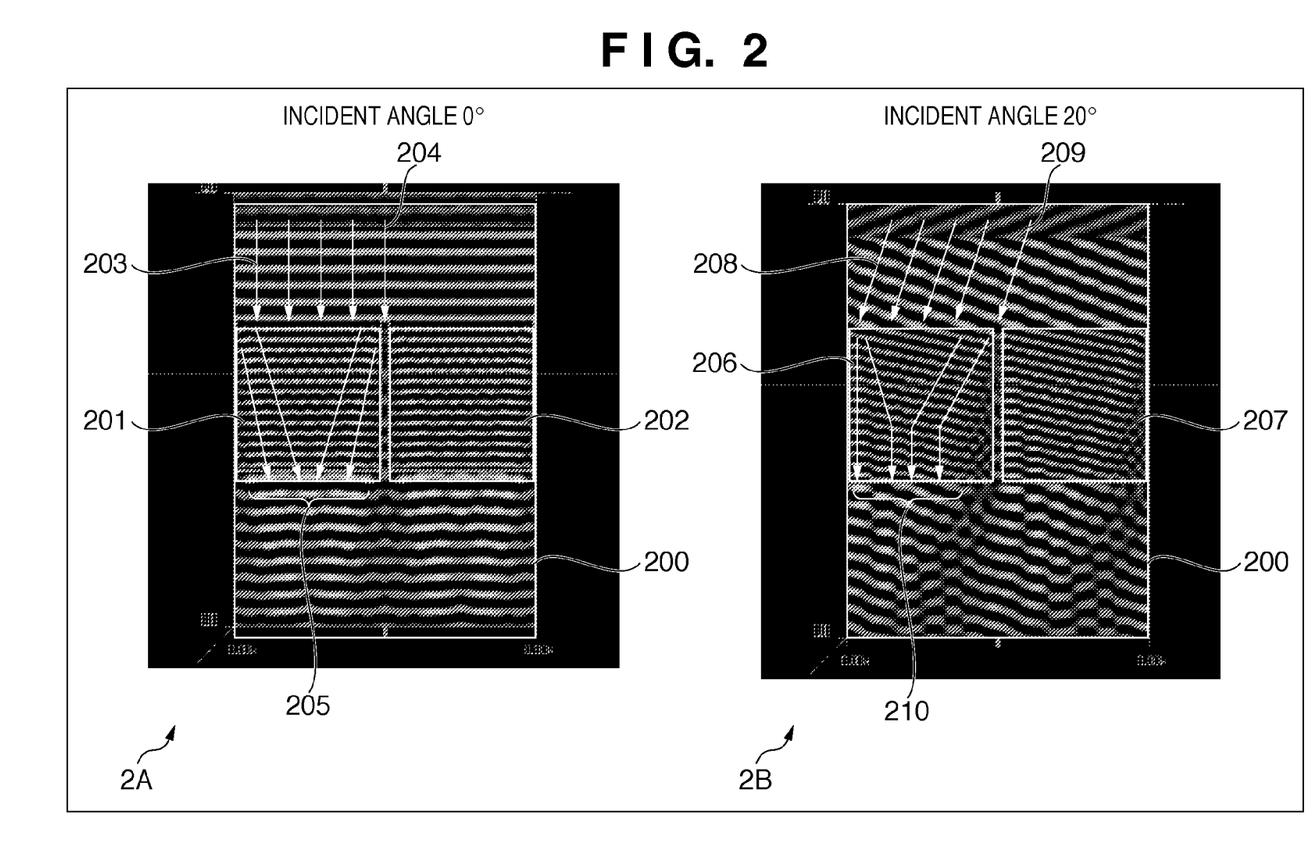

FIG. 2 includes 2A and 2B which show the results of simulating the behavior of light in the photoelectric conversion device 1 according to the first embodiment. More specifically, 2A of FIG. 2 shows the result of analyzing the behavior of light when light enters the upper surface of the light-guiding portion perpendicularly (at an incident angle of 0°). 2B of FIG. 2 shows the result of analyzing the behavior of light when light enters the upper surface of the light-guiding portion obliquely (at an incident angle of 20°).

In the simulation, the wavelength of parallel light was 500 nm, the height H of the light-guiding portion was 5.0 µm, and the clearance W between adjacent light-guiding portions 106 (i.e. the width W of the boundary portion 107) was 250 nm.

In 2A and 2B of FIG. 2, a rectangular screen 200 on a black background represents a simulation result. Black and white stripes in the screen 200 represent the behavior of light. Deeper black and white gradations mean that the amplitude of the light wave becomes larger and the light energy given by the square of the amplitude becomes higher. A gray portion represents the center of the amplitude, and means that the light energy is low.

2A of FIG. 2 shows a case where parallel light components enter the upper surface of the light-guiding portion at an incident angle of 0°. 2B of FIG. 2 shows a case where parallel light components enter the upper surface of the light-guiding portion at an incident angle of 20°. Outline arrows in 2A and 2B of FIG. 2 schematically explain behaviors of incident light depending on the difference in incident angle.

In 2A of FIG. 2, a parallel light component which is indicated by an arrow 203 and enters the vicinity of the center of a light-guiding portion 201 propagates through the light-guiding portion almost perpendicularly to a photo-sensing surface of the photoelectric conversion element. A parallel light component which is indicated by an arrow 204 and enters the boundary portion between the light-guiding portion 201 and a light-guiding portion 202 is refracted by the side surface of the light-guiding portion 201 (i.e. interface between the light-guiding portion and the boundary portion) in accordance with the difference between the refractive indices of the light-guiding portion 201 (silicon oxide) and the boundary portion (air), enters the light-guiding portion 201, and propagates through the light-guiding portion 201 toward the center on the lower surface of the light-guiding portion 201, as indicated by an arrow 205.

In 2B of FIG. 2, a parallel light component 208 which enters a light-guiding portion 206 at an incident angle of 20° is totally reflected by the side surface of the light-guiding portion 206, and propagates toward the center on the lower surface of the light-guiding portion 206 in a behavior as indicated by an arrow 210. Similar to the behavior in 2A of FIG. 2, a parallel light component 209 entering the boundary portion between the light-guiding portion 206 and a light-guiding portion 207 is refracted by the side surface of the light-guiding portion 206 (i.e. interface between the light-guiding portion and the boundary portion) in accordance with the difference between the refractive indices of the light-guiding portion 206 (a silicon oxide) and the boundary portion (air), enters the light-guiding portion 206, and propagates toward the center on the lower surface of the light-guiding portion 206, as indicated by the arrow 210.

In a conventional photoelectric conversion device, when light enters a boundary region between adjacent lenses in a lens array of microlenses two-dimensionally arrayed in correspondence with the photoelectric conversion elements 102, light often propagates straight. It is, therefore, difficult to guide light entering a boundary region on the lens array to the photo-sensing surface of the photoelectric conversion element.

To the contrary, in the photoelectric conversion device 1 according to the first embodiment, light entering a boundary portion between adjacent light-guiding portions is refracted by the side surface of the light-guiding portion (i.e. interface between the light-guiding portion and the boundary portion), enters the light-guiding portion, and is easily guided to the photo-sensing surface of the photoelectric conversion element. That is, it is easy to guide light entering the boundary portion between adjacent light-guiding portions to the photo-sensing surface of the photoelectric conversion element. Compared to the conventional photoelectric conversion device, the photoelectric conversion device 1 can increase the light collection ratio representing the ratio of light guided to the photo-sensing surface of the photoelectric conversion element to light entering the photoelectric conversion device 1.

Figure 3:
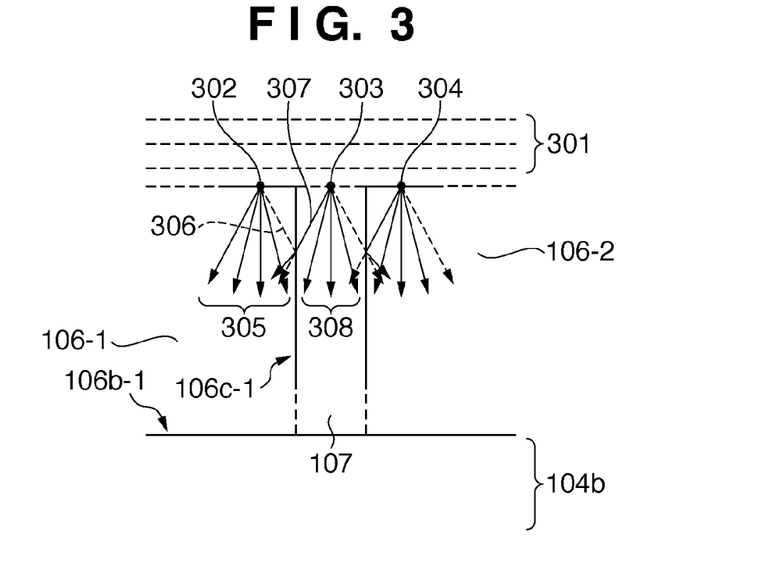
FIG. 3 is a view for explaining the behavior of light in the photoelectric conversion device according to the first embodiment.

The behavior of light in the light-guiding portion will be described in detail with reference to FIG. 3. FIG. 3 is a view for explaining the principle of collecting light when parallel light components enter a boundary portion between adjacent light-guiding portions. The same reference numerals as those in FIG. 1 denote parts having the same functions.

In FIG. 3, two light-guiding portions 106 are discriminated as light-guiding portions 106-1 and 106-2 for convenience. In FIG. 3, point sources 302, 303, and 304 represent light components immediately after parallel light components 301 enter the light-guiding portion 106-1, the boundary portion 107, and the light-guiding portion 106-2, respectively. Pluralities of light-guiding portions 106-1 and 106-2 are adjacent to each other. The point sources 302 and 304 are on the light-guiding portions 106-1 and 106-2, whereas the point source 303 is at the boundary portion (gap) 107 between the light-guiding portions 106-1 and 106-2. In this case, the width of the boundary portion 107, that is, the clearance between the light-guiding portions 106-1 and 106-2 is set to be not more than half the wavelength of the incident parallel light component 301, and not more than half the shortest wavelength in the wavelength range of visible light. The height of each of the light-guiding portions 106-1 and 106-2 is set to be not less than double the longest wavelength in the wavelength range of visible light. This will be explained by giving attention to one light-guiding portion 106-1 for convenience.

A light ray 308 entering the boundary portion 107 propagates almost straight. However, a light ray 307 having an angle enters a side surface 106c-1 of the light-guiding portion 106-1. The light ray 307 is refracted by the side surface 106c-1 of the light-guiding portion 106-1, enters the light-guiding portion 106-1, and propagates toward the center on a lower surface 106b-1 of the light-guiding portion 106-1.

In contrast, most of light rays 305 and 306 entering the light-guiding portion 106-1 are totally reflected by the side surface 106c-1 of the light-guiding portion 106-1 because the refractive indices of the light-guiding portion 106-1 and boundary portion 107 are different from each other (specifically a refractive index of the light-guiding portion 106-1 is higher than a refractive index of the boundary portion 107), so light rarely enters the boundary portion 107. Since light hardly enters the boundary portion 107, there are few light rays which intensify the light ray 308 propagating straight through the boundary portion 107. Since most light rays propagating through the boundary portion 107 enter the light-guiding portion 106-1 or 106-2, the energy of the light ray 308 propagating through the boundary portion 107 finally weakens. That is, most of the light entering the boundary portion 107 is collected to the light-guiding portion.

Figure 4:
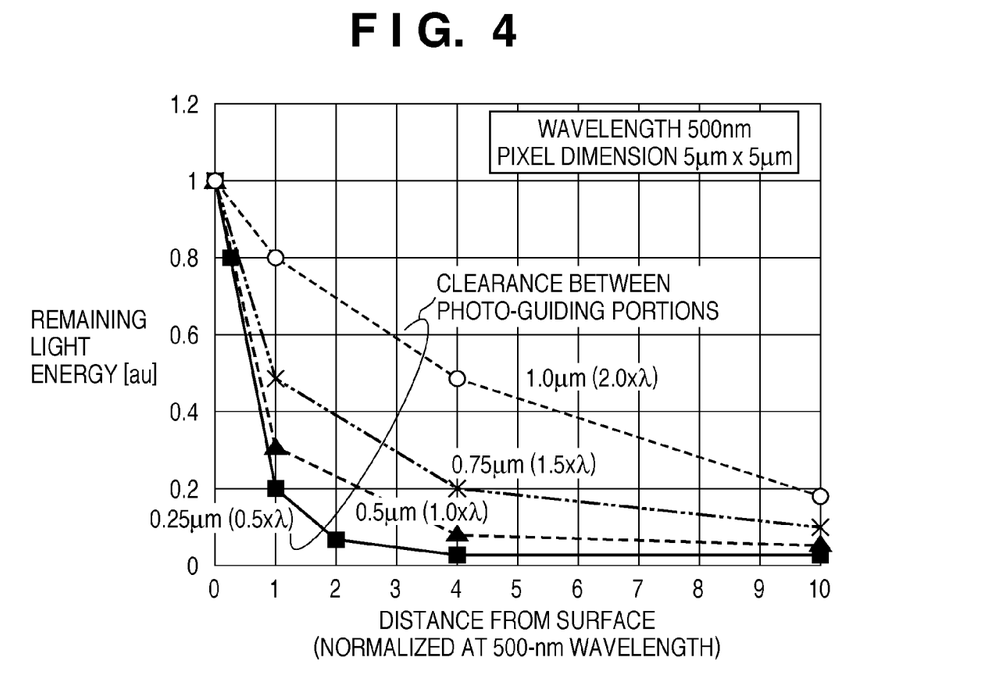
FIG. 4 is a graph showing the relationship between the height of a light-guiding portion, the clearance between light-guiding portions, and the light collection ratio.

FIG. 4 is a graph showing the relationship between the height of the light-guiding portion, the clearance between light-guiding portions (i.e. the width of the boundary portion), and the light collection ratio. The graph in FIG. 4 is obtained by the same simulation as that in 2A and 2B of FIG. 2. FIG. 4 shows the light collection ratio with respect to the height of the light-guiding portion when the wavelength of incident light is set to 500 nm, and the clearance between adjacent light-guiding portions (i.e. the width of the boundary portion) is set to 0.25 μm, 0.5 μm, 0.75 μm, and 1.0 μm. The abscissa axis of the graph represents the value of the length normalized by the wavelength when the upper surface 106a (see FIG. 1) of the light-guiding portion is defined as an origin in a direction perpendicular to the substrate, and a substrate direction in which light propagates is defined as a positive direction. In other words, the abscissa axis represents a position (optical distance from a position flush with the upper surface 106a of the light-guiding portion) in the boundary portion. The ordinate axis represents a normalized value of light energy left at the boundary portion between adjacent light-guiding portions when the value of light energy at a position of the boundary portion that is flush with the surface of the light-guiding portion is defined as 1. As described above, a decrease in light energy left in the boundary portion between adjacent light-guiding portions means that most light in the boundary portion is collected in the light-guiding portions.

As is apparent from FIG. 4, as the position in the boundary portion between light-guiding portions moves apart from a position flush with the surface of the light-guiding portion, light energy at the position in the boundary portion decreases as long as the clearance between the light-guiding portions is constant. In FIG. 4, a light energy when light propagates by a distance of two wavelengths ("2" of abscissa axis) through a boundary portion corresponding to a clearance of 1.0 μm between light-guiding portions is compared with a light energy when light propagates by a distance of two wavelengths through a boundary portion corresponding to a clearance of 0.25 μm between light-guiding portions. The light energy attenuates to about 70% in the boundary portion corresponding to a clearance of 1.0 μm between light-guiding portions, and about 10% in the boundary portion corresponding to a clearance of 0.25 μm between them.

More specifically, about 30% of light entering the boundary portion corresponding to a clearance of 1.0 μm between light-guiding portions enters the light-guiding portions. To the contrary, about 90% of light entering the boundary portion corresponding to a clearance of 0.25 μm between light-guiding portions enters the light-guiding portions. This reveals that the light collection ratio is higher for a narrower clearance between light-guiding portions (a narrower width of the boundary portion). Further, even after light propagates by a distance 10 times larger than the wavelength, 20% of light energy remains when the clearance between light-guiding portions is 1.0 μm. Thus, the same effects as those obtained when the clearance between light-guiding portions is 0.25 μm are not obtained.

From these results, light collection ratio sufficiently increases when the clearance between light-guiding portions is set half the wavelength (i.e. 0.5λ) and the height (i.e. 2λ) of the light-guiding portion suffices to be set to be not less than four times the clearance between light-guiding portions. In addition, the light collection ratio can be increased by setting the clearance between light-guiding portions shorter with respect to the wavelength and setting the light-guiding portion higher. When wavelengths are distributed, like visible light, it is more desirable to set the clearance between light-guiding portions to be not more than half the shortest wavelength in the wavelength range of visible light and set the height of the light-guiding portion to be not less than double the longest wavelength in the wavelength range of visible light. This structure can achieve a satisfactory light collection effect for all light components falling within the wavelength range of visible light. Since no complicated shape need be formed to increase the light collection ratio, the manufacturing process becomes simple, and shape control also becomes easy.

In the above-mentioned wavelength range of visible light, the shortest wavelength is 400 nm, and the longest wavelength is 750 nm. In this case, it suffices that the clearance between light-guiding portions (i.e. the width of the boundary portion) is not more than 0.2 μm and the height of the light-guiding portion is not less than 1.5 μm. For example, light-guiding portions are formed at a clearance of about 0.2 μm between light-guiding portions (i.e. a boundary portion is formed at a width of about 0.2 μm) and a light-guiding portion height of about 1.5 μm. The photoelectric conversion device 1 having light-guiding portions which increase the light collection ratio of visible light can be used especially as a visible light photoelectric conversion device. At this time, the photoelectric conversion element is desirably formed to have a spectral sensitivity corresponding to visible light.

The wavelength range of light actually entering the photoelectric conversion device 1 can be predicted to a certain degree (for example, it is determined by a wavelength passing through a color filter). Thus, the clearance between light-guiding portions and the height of the light-guiding portion can also be designed based on the wavelength range of the light source. For example, several light sources (wavelengths passing through a color filter) are assumed, and the clearance between light-guiding portions and the height are selected to cover the wavelength ranges of light rays from these light sources.

The longest and shortest wavelengths which define the height of the light-guiding portion and clearance between light-guiding portions may also be determined using the wavelength range of visible light, as described above, but can also be defined as follows. For example, the clearance between light-guiding portions and the height of the light-guiding portion may also be defined from the distribution of the spectral sensitivity (photoelectric conversion efficiency with respect to the wavelength of incident light) of the photoelectric conversion element.

For example, the lower limit value of the spectral sensitivity that is permitted in the spectral sensitivity distribution of the photoelectric conversion element is defined. Accordingly, the upper limit (on the side of the infrared band) and lower limit (on the side of the ultraviolet band) of the wavelength can be set.

For example, when the spectral sensitivity of the photoelectric conversion element has a peak, wavelengths at the upper and lower limits of a wavelength range when the light intensity becomes half the peak can also be used. Wavelengths at the upper and lower limits of a wavelength range when the light intensity becomes half the peak are those at the lower and upper limits when obtaining the full width at half maximum. The spectral sensitivity of the photoelectric conversion element can be properly determined depending on the type of semiconductor which forms a photoelectric conversion element, the formation method, and the like. Light-guiding portions set in the above-described manner can efficiently collect light corresponding to the sensitivity peak of the photoelectric conversion element.

When color filters are arranged to split light into wavelengths and perform photoelectric conversion in each pixel, the wavelength range of incident light can be estimated and defined from the spectral transmittance (intensity of light passing through the color filter with respect to each wavelength) of the color filter. For the photoelectric conversion device 1 having color filters of primary colors, it suffices to select the shortest wavelength in the wavelength range of visible light from the spectral transmittance of a blue color filter, and the longest wavelength from the spectral transmittance of a red color filter. For example, the longest wavelength can be selected from wavelengths when light exhibits an intensity half the peak at the spectral transmittance of a red color filter. The shortest wavelength can be selected from wavelengths when light exhibits an intensity half the peak at the spectral transmittance of a blue color filter. A wavelength when light exhibits a peak intensity may also be selected. The wavelength may also be set by combining the spectral sensitivity of the photoelectric conversion element and the spectral transmittance of the color filter. By setting the wavelength in this fashion, light corresponding to the sensitivity peak of the photoelectric conversion element can be efficiently collected.

In the photoelectric conversion device 1 according to the first embodiment, light entering a region (boundary portion) where no light-guiding portion exists enters the light-guiding portion from its side surface, propagates toward the center of the bottom surface, and is guided to the photo-sensing surface of the photoelectric conversion element, increasing the light collection ratio. In the first embodiment, air is filled between light-guiding portions, but a material lower in refractive index than the light-guiding portion may also be arranged. The material of the light-guiding portion is not limited to the above-described one.

The first embodiment has described a multilayered interconnection structure made up of insulation films of plural layers and a wiring layer. However, the first embodiment is also applicable to the structure of a CCD photoelectric conversion device or the like, or a structure in which a light-guiding portion is arranged on a transparent electrode.

(Second Embodiment)

Figure 5:
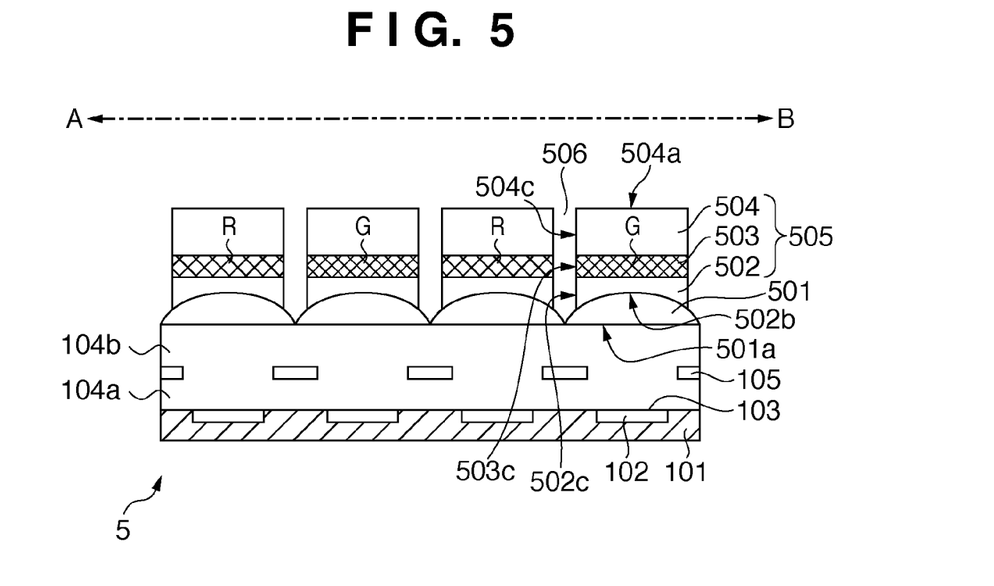
FIG. 5 is a sectional view of a photoelectric conversion device according to the second embodiment.
Figure 6:
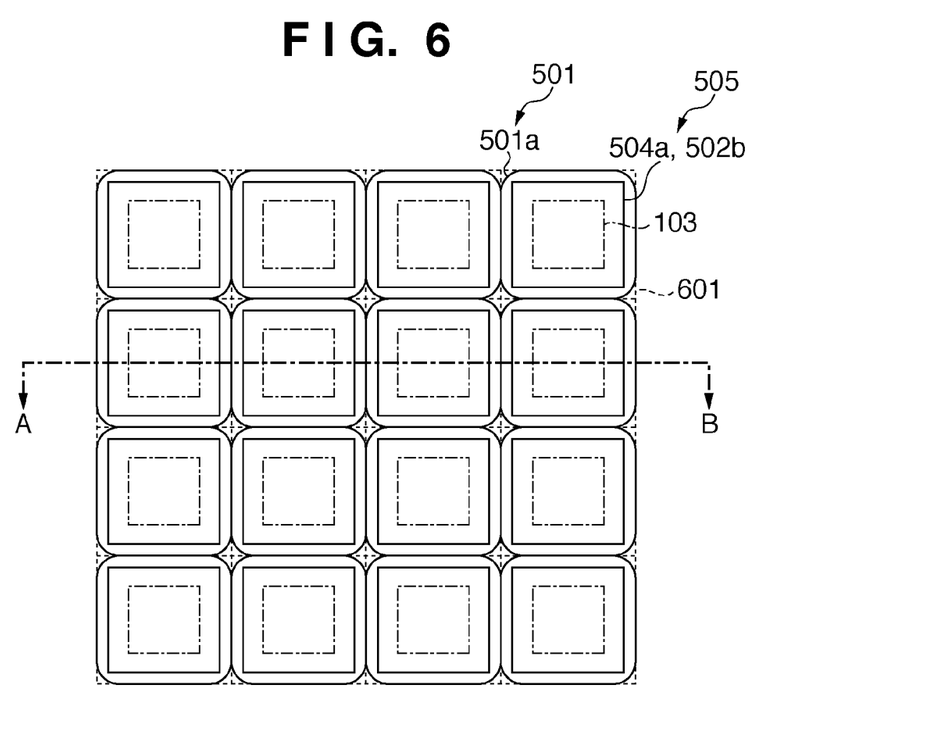
FIG. 6 is a plan view of the photoelectric conversion device according to the second embodiment.

A photoelectric conversion device 5 according to the second embodiment has a lens array, and a color filter array corresponding the lens array. Each color filter of the color filter array is included in a light-guiding portion, in addition to the structure of the first embodiment. FIG. 5 is a sectional view of the photoelectric conversion device 5 according to the second embodiment, and FIG. 6 is a plan view of the photoelectric conversion device 5. The same reference numerals as those in FIG. 1 denote the same parts, and a description thereof will not be repeated.

In FIG. 5, lenses 501 are interposed between light-guiding portions 505 and an insulation film 104b. The plurality of lenses 501 are two-dimensionally arrayed in correspondence with respective photoelectric conversion elements 102.

Each light-guiding portion 505 includes a color filter 503. By interposing the lens 501 between the light-guiding portion 505 and the insulation film 104b, light collected by the light-guiding portion 505 can be efficiently collected on a photo-sensing surface 103 of the photoelectric conversion element. Since the light-guiding portion 505 includes the color filter 503, the color filter 503 can be arranged without increasing the height of the photoelectric conversion device 5 from the photo-sensing surface 103. In other words, the distance between the photo-sensing surface 103 and the color filter 503 in the photoelectric conversion device 5 can be shortened.

The color filter 503 is desirably formed from a material equal in refractive index to a lower portion 502 and upper portion 504 of the light-guiding portion 505. This refractive index relationship can reduce reflection of light at the interface between the color filter 503 and the lower portion 502 or upper portion 504 of the light-guiding portion.

A side surface 503c of the color filter 503 preferably forms a surface continuous from a side surface 502c of the lower portion 502 of the light-guiding portion 505 and a side surface 504c of the upper portion 504.

If the side surface of the color filter is dented to the inside of the light-guiding portion from the side surfaces of the upper and lower portions of the light-guiding portion, even light entering the light-guiding portion 505 may not pass through the color filter 503, degrading the color selectivity. The side surface of the color filter is dented to the inside of the light-guiding portion from the side surfaces of the upper and lower portions of the light-guiding portion when the color filter is smaller in lateral width than the upper surface or lower surface of the light-guiding portion when viewed from the top (in a direction perpendicular to the sheet surface of FIG. 5).

If the side surface of the color filter projects to the outside (toward the boundary portion) of the light-guiding portion from the side surfaces of the upper and lower portions of the light-guiding portion 505, even light entering a boundary portion 506 may not enter the light-guiding portion, decreasing the light collection ratio. The side surface of the color filter projects to the outside (toward the boundary portion) of the light-guiding portion from the side surfaces of the upper and lower portions of the light-guiding portion when the color filter is larger in lateral width than the light-guiding portion when viewed from the top (in a direction perpendicular to the sheet surface of FIG. 5).

The relationship in two-dimensional size between the lens 501 and the light-guiding portion 505 will be explained with reference to FIG. 6. FIG. 6 is a plan view showing the layout of photo-sensing surfaces 103 of photoelectric conversion elements, pixels 601 including the photoelectric conversion elements, the lenses 501, and the light-guiding portions 505. A lower surface 501a of the lens 501 is larger than Aan upper surface 504a or lower surface 502b of the light-guiding portion 505 (see FIG. 6). In this structure, the lens 501 can focus light collected by the light-guiding portion 505 on the photo-sensing surface 103 (as indicated by a dashed broken line) without any loss. The lens 501 is formed from a material higher in refractive index than the light-guiding portion 505, and is a convex lens. However, when the refractive index of the lens 501 is lower than that of the light-guiding portion 505, the lens 501 may also be a concave lens. The material and shape of the lens 501 can be properly designed.

When perspectively viewed from a direction perpendicular to the photo-sensing surface 103, the photo-sensing surface 103 of the photoelectric conversion element is included in the lower surface 501a of the lens 501 (is positioned inside), and included in the upper surface 504a and bottom surface 502b of the light-guiding portion 505 (is positioned inside).

Figure 7:
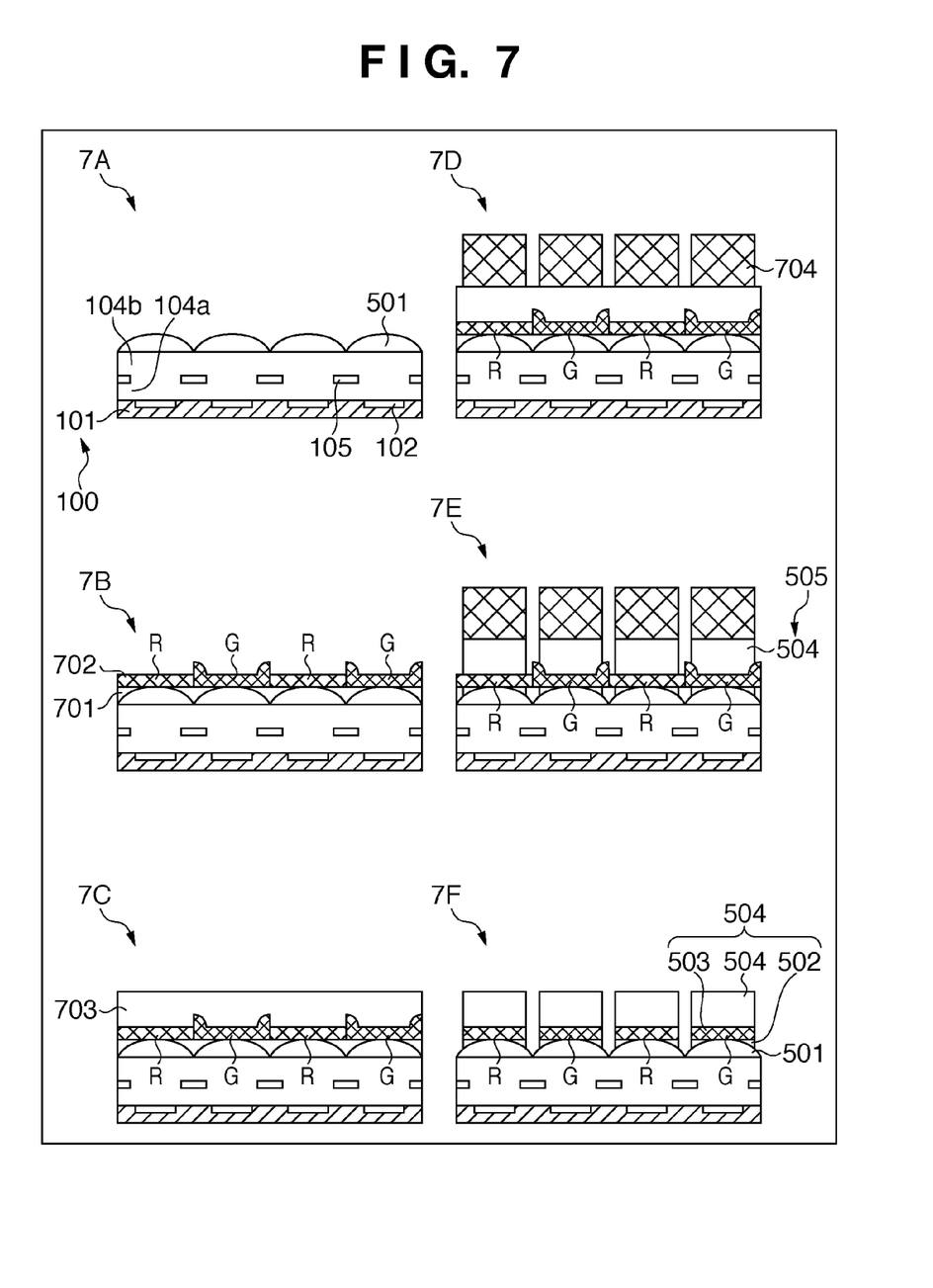

7A to 7F of FIG. 7 show an example of a method of manufacturing the photoelectric conversion device 5 according to the second embodiment.

In the step of 7A of FIG. 7, impurity ions of the first conductivity type are implanted into a substrate 100, forming a well 101 in the substrate 100. Further, impurity ions of the second conductivity type are implanted into predetermined regions in the substrate 100, forming photoelectric conversion elements 102 arranged to be surrounded by the well 101 in the substrate 100.

Then, an insulation film 104*a* is formed on the substrate 100. A wiring layer 105 is formed on the insulation film 104*a*. An insulation film 104*b* is formed to cover the insulation film 104*a* and wiring layer 105.

The numbers of stacked insulation films and wiring layers are set properly.

Lenses 501 are formed on the insulation film 104*b*. The lens 501 is formed of, for example, silicon nitride.

In the step of 7B of FIG. 7, a planarization layer 701 is formed to cover the lenses 501. The planarization layer 701 has a flat upper surface. The planarization layer 701 and color filters 702 are formed from, for example, a resin.

Red (R), green (G), and blue (B) color filters 702 are formed on the planarization layer 701. The color filters 702 are formed of, for example, a resin.

In the step of 7C of FIG. 7, a transparent film 703 serving as light-guiding portions is formed on the color filters 702. The transparent film 703 can be formed of, for example, silicon oxide. The silicon oxide is desirably formed by, for example, a spin-on-glass method capable of forming silicon oxide at low temperature so as not to deteriorate semiconductor elements, lenses, and color filters which have already been formed.

In the step of 7D of FIG. 7, an etching mask 704 is formed on the transparent film 703. The etching mask 704 is formed by patterning a photoresist into the pattern (see FIG. 6) of the light-guiding portions 505 by photolithography.

In the step of 7E of FIG. 7, the transparent film 703 is etched using the etching mask 704, forming upper portions 504 of the light-guiding portions 505. When the transparent film is made of silicon oxide, anisotropic etching is executed using CF gas.

In the step of 7F of FIG. 7, to complete the light-guiding portions 505, the color filters 702 and planarization layer 701 are etched. As an etching method, anisotropic etching is done using an oxygen-containing gas, removing part of the color filters and planarization layer. As a result, the color filters 503 and lower portions 502 of the light-guiding portions 505 are formed. At the same time, the etching mask 704 formed on the transparent film 703 is also etched away. The lens 501 formed of a silicon nitride can also function as an etching stop layer.

Further, microlenses (not shown) and the like are formed on the light-guiding portions 505.

In this fashion, the photoelectric conversion device 5 according to the second embodiment is formed.

The second embodiment employs color filters of primary colors (R, G, and B). Hence, the clearance between light-guiding portions (i.e. the width of the boundary portion) and the height of the light-guiding portion can be designed in accordance with the characteristics of the color filters of the respective colors, as described in the first embodiment. For example, the shortest wavelength in a wavelength range where light passing through a B color filter exhibits an intensity half the peak is set as the shortest wavelength in the wavelength range of visible light. The longest wavelength in a wavelength range where light passing through an R color filter exhibits an intensity half the peak is set as the longest wavelength in the wavelength range of visible light. Based on these settings, the clearance between light-guiding portions and the height of the light-guiding portion are defined.

In the second embodiment, the planarization layer is arranged below the color filter, but is not always necessary. When no planarization layer is arranged, the interface between different media in the light-guiding portion can be eliminated, reducing interfacial reflection. As described above, according to the manufacturing method of the second embodiment, a photoelectric conversion device with high light collection efficiency can be manufactured by a simple method using a semiconductor process. This manufacturing method is also applicable to other embodiments.

(Third Embodiment)

Figure 8:
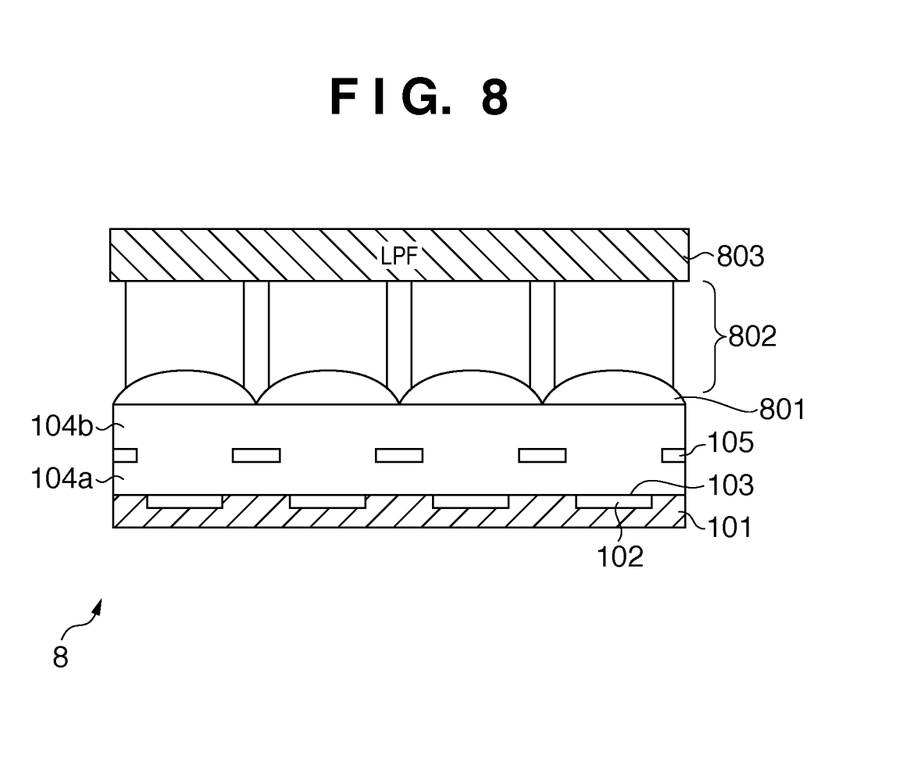
FIG. 8 is a sectional view of a photoelectric conversion device according to the third embodiment.

The third embodiment has a feature in that a low-pass filter as an optical member is arranged on light-guiding portions. FIG. 8 is a sectional view of a photoelectric conversion device 8 according to the third embodiment. The same reference numerals as those in FIG. 1 denote the same parts, and a description thereof will not be repeated.

In FIG. 8, lenses 801 are formed on an insulation film 104*b*, and light-guiding portions 802 are formed on the lenses 801. The detailed structure of the light-guiding portion 802 is the same as that in the first embodiment, and a description thereof will not be repeated. A low-pass filter 803 is arranged on the light-guiding portions 802.

Conventionally when arranging a low-pass filter in a photoelectric conversion device while considering even the light collection ratio, a fiber optic plate (FOP) needs to be interposed between the photoelectric conversion device and the low-pass filter. It is also necessary to arrange a microlens on the photoelectric conversion device and interpose a planarization layer between the microlens and the low-pass filter.

To the contrary, the upper surface of the light-guiding portion 802 is flat in the photoelectric conversion device 8 according to the third embodiment, so the low-pass filter 803 can be arranged on the photoelectric conversion element without the mediacy of an FOP or planarization layer. Since interfaces formed by arranging an FOP and planarization layer can be eliminated, reflection of light at the interfaces can be prevented.

The third embodiment uses a low-pass filter as an optical member. Other examples of the optical member are a wavelength converter, planoconvex lens, planoconcave lens, and color filter. These optical members may also be properly combined and stacked. This structure facilitates mounting. Since an optical element can be arranged near a photoelectric conversion element, the light collection ratio can be increased, and aberration can also be reduced.

(Application to Imaging System)

Figure 9:
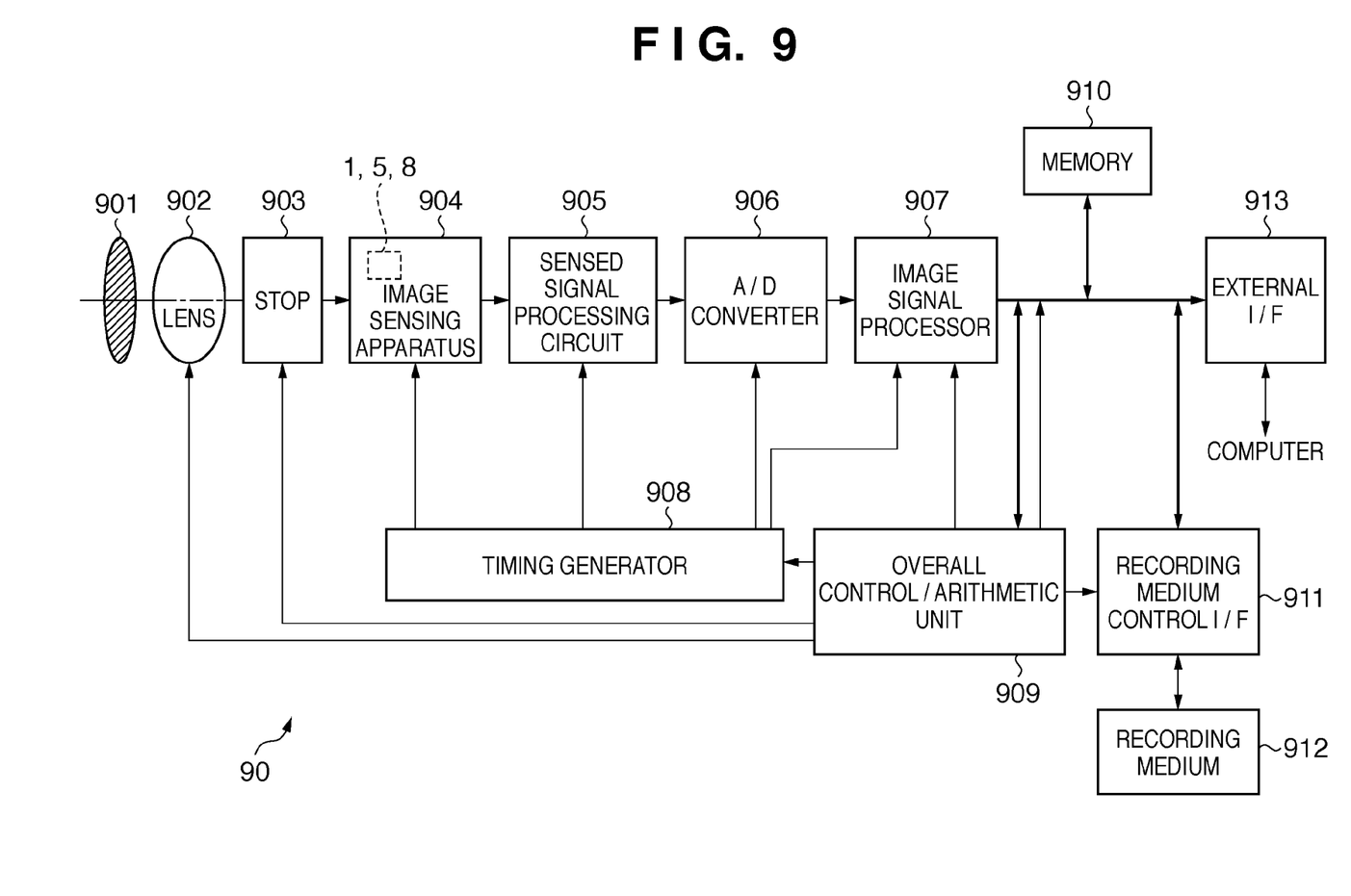
FIG. 9 is a block diagram for explaining an imaging system.

FIG. 9 is a block diagram when a photoelectric conversion device described in each of the first to third embodiments of the present invention is applied to an imaging system. The imaging system is, for example, a digital camera or video camcorder.

As shown in FIG. 9, an imaging system 90 mainly comprises an optical system, image sensing apparatus 904, and signal processing unit. The optical system mainly comprises a shutter 901, photographing lens 902, and stop 903. The image sensing apparatus 904 includes a photoelectric conversion device 1 (or 5 or 8). The signal processing unit mainly comprises a sensed signal processing circuit 905, A/D converter 906, image signal processor 907, memory 910, external I/F 913, timing generator 908, overall control/arithmetic unit 909, recording medium 912, and recording medium control I/F 911. The signal processing unit may not comprise the recording medium 912.

The shutter 901 is arranged in front of the photographing lens 902 on the optical path to control the exposure.

The photographing lens 902 refracts incident light to form an object image on the image sensing plane of the photoelectric conversion device 1 in the image sensing apparatus 904.

The stop 903 is interposed between the photographing lens 902 and the photoelectric conversion device 1 on the optical path, and adjusts the quantity of light guided to the photoelectric conversion device 1 after passing through the photographing lens 902.

The photoelectric conversion device 1 of the image sensing apparatus 904 converts the object image formed on the image sensing plane of the photoelectric conversion device 1 into an image signal. The image sensing apparatus 904 reads out the image signal from the photoelectric conversion device 1, and outputs it.

The sensed signal processing circuit 905 is connected to the image sensing apparatus 904, and processes the image signal output from the image sensing apparatus 904.

The A/D converter 906 is connected to the sensed signal processing circuit 905, and converts the processed image signal (analog signal) output from the sensed signal processing circuit 905 into an image signal (digital signal).

The image signal processor 907 is connected to the A/D converter 906, and performs various arithmetic processes such as correction for the image signal (digital signal) output from the A/D converter 906, generating image data. The image signal processor 907 supplies the image data to the memory 910, external I/F 913, overall control/arithmetic unit 909, recording medium control I/F 911, and the like in accordance with the setting (instruction) of an operation mode accepted by the overall control/arithmetic unit 909 from the user via an input unit (e.g., a shutter button).

The memory 910 is connected to the image signal processor 907, and stores (accumulates) image data output from the image signal processor 907.

The external I/F 913 is connected to the image signal processor 907. The external I/F 913 can transmit image data output from the image signal processor 907 to an external device such as a computer or printer.

The recording medium 912 is detachably connected to the recording medium control I/F 911. The recording medium 912 records image data output from the image signal processor 907 via the recording medium control I/F 911.

The timing generator 908 is connected to the image sensing apparatus 904, sensed signal processing circuit 905, A/D converter 906, and image signal processor 907. The timing generator 908 supplies timing signals to the image sensing apparatus 904, sensed signal processing circuit 905, A/D converter 906, and image signal processor 907. The image sensing apparatus 904, sensed signal processing circuit 905, A/D converter 906, and image signal processor 907 operate in synchronism with the timing signals.

The overall control/arithmetic unit 909 is connected to the timing generator 908, image signal processor 907, and recording medium control I/F 911, and controls all of them.

The image sensing apparatus 904 including the photoelectric conversion device 1, and the A/D converter 906 may also be formed on a single substrate (substrate 100 in FIG. 1), or may also be formed by a single step. The image sensing apparatus 904 including the photoelectric conversion device 1, and other building elements of the imaging system 90 may also be formed on a single substrate, and can also be formed by a single step.

When the imaging system adopts the photoelectric conversion device according to the present invention, the number of mounted components for arranging a low-pass filter and the like can be reduced. A smaller-size imaging system can be manufactured.

As described above, the present invention can provide a photoelectric conversion element which increases the light collection ratio.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. The above-described embodiments can also be combined with each other.

This application claims the benefit of Japanese Patent Application No. 2007-259874, filed Oct. 3, 2007, which is hereby incorporated by reference herein in its entirety.

The invention claimed is:

1. A photoelectric conversion device comprising:
a plurality of photoelectric conversion elements each having a photo-sensing surface;
a wiring layer arranged above the plurality of photoelectric conversion elements;
an insulation film arranged above the wiring layer;
a plurality of light-guiding portions arranged above the insulation film, each of the plurality of light-guiding portions guiding light onto a respective photo-sensing surface of a photoelectric conversion element of the plurality of photoelectric conversion elements;
a boundary portion defining a boundary between adjacent light-guiding portions and being formed of a material lower in refractive index than a material that forms the plurality of light-guiding portions; and
a plurality of lenses interposed between the insulation film and the plurality of light-guiding portions, a part of each of the plurality of lenses being in contact with the boundary portion,
wherein a width of the boundary portion is not more than half a shortest wavelength in a wavelength range of visible light, and
wherein a height from a lower surface to an upper surface of each of the plurality of light-guiding portions is not less than double a longest wavelength in the wavelength range of visible light.

2. The device according to claim 1, wherein
each of the plurality of lenses is formed of silicon nitride, and
each of the plurality of light-guiding portions is formed of silicon oxide.

3. The device according to claim 1, wherein upper surfaces of the plurality of light-guiding portions are flush with each other and flat.

4. The device according to claim 3, further comprising a low-pass filter arranged on the plurality of light-guiding portions.

5. The device according to claim 1, further comprising a plurality of color filters arranged above the plurality of photoelectric conversion elements.

6. The device according to claim 5, wherein the plurality of color filters is included in the plurality of light-guiding portions, respectively.

7. The device according to claim 5, wherein
the plurality of color filters include color filters of primary colors,
the shortest wavelength in the wavelength range of visible light is a wavelength defined by a spectral transmittance distribution of a blue color filter, and
the longest wavelength in the wavelength range of visible light is a wavelength defined by a spectral transmittance distribution of a red color filter.

8. The device according to claim 5, wherein the shortest wavelength and the longest wavelength in a wavelength range of visible light are, respectively, defined by a spectral transmittance distribution of a color filter.

9. The device according to claim 1, wherein
the width of the boundary portion is not more than 0.2 µm, and
the height from a lower surface to an upper surface of each of the plurality of light-guiding portions is not less than 1.5 µm.

10. The device according to claim 1, wherein the device is incorporated in an imaging system that includes:
an optical system which forms an image on an image sensing plane of a photoelectric conversion element; and
a signal processing unit, which processes a signal output from the photoelectric conversion device to generate image data.

11. The device according to claim 1, wherein the wavelength range of visible light includes a wavelength range from 400 nm to 750 nm.

12. The device according to claim 1, wherein
plural layers of insulation films are arranged on the plurality of photoelectric conversion elements, and
the plurality of light-guiding portions are arranged above the plural layers of insulation films.

13. The device according to claim 1, wherein the boundary portion includes a plurality of boundary parts each defining a boundary between an adjacent light-guiding portion.

14. The device according to claim 13, wherein the plurality of boundary parts are arranged so as to form a lattice.

15. The device according to claim 1, wherein each of the plurality of lenses has a shape that is convex upward and each of the plurality of lenses is formed from a material higher in refractive index than the plurality of light-guiding portions.

16. The device according to claim 1, further comprising an optical member arranged on the plurality of light-guiding portions.

17. The device according to claim 1, wherein each one of the plurality of light-guiding portions corresponds to a photoelectric conversion element of the plurality of photoelectric conversion elements.

18. A photoelectric conversion device comprising:
a plurality of photoelectric conversion elements each having a photo-sensing surface;
a wiring layer arranged above the plurality of photoelectric conversion elements;
an insulation film arranged above the wiring layer;
a plurality of light-guiding portions arranged above the insulation film, each of the plurality of light-guiding portions guiding light onto a respective photo-sensing surface of a photoelectric conversion element of the plurality of photoelectric conversion elements;
a boundary portion defining a boundary between adjacent light-guiding portions and being formed of a material lower in refractive index than a material that forms the plurality of light-guiding portions; and
a plurality of lenses interposed between the insulation film and the plurality of light-guiding portions, a part of each of the plurality of lenses being in contact with the boundary portion,
wherein a width of the boundary portion is not more than half a shortest wavelength in a wavelength range of visible light, and
wherein a height from a lower surface to an upper surface of each of the plurality of light-guiding portions is not less than four times the width of each of the boundary portions.

19. The device according to claim 18, wherein the device is incorporated in an imaging system that includes:
an optical system, which forms an image on an image sensing plane of a photoelectric conversion element; and
a signal processing unit, which processes a signal output from the photoelectric conversion device to generate image data.

20. The device according to claim 18, wherein the wavelength range of visible light includes a wavelength range from 400 nm to 750 nm.

21. The device according to claim 18, wherein
plural layers of insulation films are arranged on the plurality of photoelectric conversion elements, and
the plurality of light-guiding portions are arranged above the plural layers of insulation films.

22. The device according to claim 18, wherein the boundary portion includes a plurality of boundary parts each defining a boundary between an adjacent light-guiding portion.

23. The device according to claim 22, wherein the plurality of boundary parts are arranged so as to form a lattice.

24. A photoelectric conversion device comprising:
a plurality of photoelectric conversion elements each having a photo-sensing surface;
a wiring layer arranged above the plurality of photoelectric conversion elements;
an insulation film arranged above the wiring layer;
a plurality of light-guiding portions arranged above the wiring layer, each of the plurality of light-guiding portions corresponding to a photoelectric conversion element of the plurality of photoelectric conversion elements;
a boundary portion defining a boundary between adjacent light-guiding portions and being formed of a material lower in refractive index than a material that forms the plurality of light-guiding portions; and
a plurality of lenses interposed between the insulation film and the plurality of light-guiding portions, a part of each of the plurality of lenses being in contact with the boundary portion,
wherein a width of the boundary portion is not more than half a shortest wavelength in a wavelength range of visible light, and
wherein a height from a lower surface to an upper surface of each of the plurality of light-guiding portions is not less than double a longest wavelength in the wavelength range of visible light.

25. The device according to claim 24, wherein the device is incorporated in an imaging system that includes:
an optical system, which forms an image on an image sensing plane of a photoelectric conversion element; and
a signal processing unit, which processes a signal output from the photoelectric conversion device to generate image data.

26. The device according to claim 24, wherein the wavelength range of visible light includes a wavelength range from 400 nm to 750 nm.

27. The device according to claim 24, wherein
plural layers of insulation films are arranged on the plurality of photoelectric conversion elements, and
the plurality of light-guiding portions are arranged above the plural layers of insulation films.

28. The device according to claim 24, wherein the boundary portion includes a plurality of boundary parts each defining a boundary between an adjacent light-guiding portion.

29. The device according to claim 28, wherein the plurality of boundary parts are arranged so as to form a lattice.

30. A photoelectric conversion device comprising:
a plurality of photoelectric conversion elements each having a photo-sensing surface;
a wiring layer arranged above the plurality of photoelectric conversion elements;

an insulation film arranged above the wiring layer;
a plurality of layered structures arranged above the wiring layer, each of the plurality of layered structures corresponding to a respective one of the plurality of photoelectric conversion elements;
a boundary portion defining a boundary between adjacent layered structures, the boundary portion being filled with air; and
a plurality of lenses interposed between the wiring layer and the plurality of layered structures, a part of each of the plurality of lenses being in contact with the boundary portion,
wherein a width of the boundary portion is not more than half a shortest wavelength in a wavelength range of visible light, and
wherein a height of the boundary portion is not less than double a longest wavelength in the wavelength range of visible light.

31. A photoelectric conversion device comprising:
a plurality of photoelectric conversion elements each having a photo-sensing surface;
a wiring layer arranged above the plurality of photoelectric conversion elements;
an insulation film arranged above the wiring layer;
a plurality of layered structures arranged above the wiring layer, each of the plurality of layered structures corresponding to respective one of the plurality of photoelectric conversion elements, each of the plurality of layered structures having an insulating layer, a color filter arranged on the insulating layer, and an insulating layer arranged on the color filter;
a boundary portion defining a boundary between adjacent layered structures, the boundary portion being filled with air; and
a plurality of lenses interposed between the wiring layer and the plurality of layered structures, a part of each of the plurality of lenses being in contact with the boundary portion,
wherein a width of the boundary portion is not more than half a shortest wavelength in a wavelength range of visible light, and
wherein a height of the boundary portion is not less than double a longest wavelength in the wavelength range of visible light.

32. The device according to claim 31, wherein the width of the boundary portion is not more than 0.2 µm, and the height from a lower surface to an upper surface of each of the plurality of light-guiding portions is not less than 1.5 µm.

33. A photoelectric conversion device comprising:
a structure of a plurality of photoelectric conversion elements each having a photo-sensing surface and a wiring layer;
an insulation film arranged above the structure;
a plurality of light-guiding portions arranged above the insulation film, each of the plurality of light-guiding portions corresponding to a photoelectric conversion element of the plurality of photoelectric conversion elements;
a boundary portion defining a boundary between adjacent light-guiding portions and being formed of a material lower in refractive index than a material that forms the plurality of light-guiding portions; and
a plurality of lenses interposed between the insulation film and the plurality of light-guiding portions, a part of each of the plurality of lenses being in contact with the boundary portion,
wherein a width of the boundary portion is not more than half a shortest wavelength in a wavelength range of visible light, and
wherein a height from a lower surface to an upper surface of each of the plurality of light-guiding portions is not less than double a longest wavelength in the wavelength range of visible light.

* * * * *